(12) United States Patent
Al-Nasser et al.

(10) Patent No.: US 11,715,034 B2
(45) Date of Patent: Aug. 1, 2023

(54) TRAINING OF MACHINE LEARNING ALGORITHMS FOR GENERATING A RESERVOIR DIGITAL TWIN

(71) Applicant: Saudi Arabian Oil Company, Dhahran (SA)

(72) Inventors: Mamdouh N. Al-Nasser, Dhahran (SA); Ahmed A. Al Sulaiman, Dammam (SA)

(73) Assignee: Saudi Arabian Oil Company, Dhahran (SA)

( * ) Notice: Subject to any disclaimer, the term of this patent is extended or adjusted under 35 U.S.C. 154(b) by 729 days.

(21) Appl. No.: 16/744,628

(22) Filed: Jan. 16, 2020

(65) Prior Publication Data
US 2021/0224682 A1    Jul. 22, 2021

(51) Int. Cl.
*G01V 99/00*       (2009.01)
*G06N 20/00*       (2019.01)
*G06F 30/27*       (2020.01)

(52) U.S. Cl.
CPC .......... *G06N 20/00* (2019.01); *G01V 99/005* (2013.01); *G06F 30/27* (2020.01); *E21B 2200/20* (2020.05)

(58) Field of Classification Search
CPC ......... G06T 17/05; G06N 20/00; G06F 30/23; G06F 30/27; G01V 99/005; E21B 2200/20; E21B 2200/22
See application file for complete search history.

(56) References Cited

U.S. PATENT DOCUMENTS 6,549,879 B1    4/2003 Cullick et al.
9,031,820 B2    5/2015 Frederick
(Continued)

FOREIGN PATENT DOCUMENTS

WO    WO2018045255    3/2018

OTHER PUBLICATIONS

Walmsley et al., "Well Placement and Geological Evaluation of a North Sea Horizontal Water Injector Using LWD Technology," Society of Petroleum Engineers, SPE Offshore Europe Conference & Exhibition held in Aberdeen, United Kingdom, Sep. 5-8, 2017, 9 pages.

(Continued)

*Primary Examiner* — Kibrom K Gebresilassie
(74) *Attorney, Agent, or Firm* — Fish & Richardson P.C.

(57) ABSTRACT

Methods for training machine learning algorithms for generation of a reservoir digital twin include receiving information obtained from hydrocarbon wells. The information includes porosity logs, petrophysical data, rock typing data, pressure transient test results, vertical production logs, reservoir pressure logs, reservoir saturation logs, production performance, and injection performance. The reservoir saturation logs are normalized in accordance with time. A machine learning algorithm is trained using the reservoir pressure logs, the production performance, and the injection performance to provide variations in reservoir pressure of the hydrocarbon reservoir in accordance with time. The machine learning algorithm is trained to provide variations in reservoir saturation of the hydrocarbon reservoir in accordance with time. The machine learning algorithm is trained using the reservoir saturation logs, the vertical production logs, the production performance, the injection performance, the reservoir pressure logs, and the petrophysical data.

20 Claims, 5 Drawing Sheets

(56) References Cited

U.S. PATENT DOCUMENTS

| | | | |
|---|---|---|---|
| 2012/0158389 A1 | 6/2012 | Wu et al. | |
| 2012/0179444 A1* | 7/2012 | Ganguly | E21B 43/26 703/10 |
| 2013/0096898 A1* | 4/2013 | Usadi | E21B 43/00 703/10 |
| 2013/0096899 A1 | 4/2013 | Usadi et al. | |
| 2013/0096900 A1 | 4/2013 | Usadi et al. | |
| 2013/0118736 A1 | 5/2013 | Usadi et al. | |
| 2016/0177679 A1* | 6/2016 | Zhang | E21B 43/20 702/6 |
| 2016/0342903 A1 | 11/2016 | Shumpert | |
| 2017/0364795 A1 | 12/2017 | Anderson et al. | |
| 2020/0124753 A1 | 4/2020 | Halsey et al. | |
| 2021/0209262 A1* | 7/2021 | Li | E21B 41/00 |
| 2021/0216683 A1* | 7/2021 | Rai | B29C 64/386 |
| 2021/0225070 A1 | 7/2021 | Al-Nasser | |

OTHER PUBLICATIONS

Halliburton [online], "Digital Twin Implementation for Integrated Production & Reservoir Management," iEnergy, 2018, retrieved on Sep. 27, 2019, retrieved from URL: <https://www.ienergy.community/Portals/1/IenergyDocs/Marketing/DigitalTwin_Integrated_Reservoir_Production.pdf>, 17 pages.

PCT International Search Report and Written Opinion in International Appln. No. PCT/US2021/013418, dated Apr. 30, 2021, 13 pages.

PCT International Search Report and Written Opinion in International Appln. No. PCT/US2021/013419, dated May 3, 2021, 14 pages.

Ertekin et al., "Artificial Intelligence Applications in Reservoir Engineering: A Status Check," Energies, Jul. 2019, XP055776157, 12(15): 2897, 22 pages.

Mohaghegh, "Reservoir simulation and modeling based on artificial intelligence and data mining (AI&DM)," Journal of Natural Gas Science and Engineering, Aug. 2011, 3(6): 697-705, XP028125623, 9 pages.

Saumya et al., "Saturation Forecast Using Machine Learning: Enabling Smarter Decision-Making Capabilities," SPE-197419-MS, Society of Petroleum Engineers, Nov. 2019, XP055796992, 10 pages.

Sudakov et al., "Artificial Neural Network Surrogate Modeling of Oil Reservoir: A Case Study," Springer International Publishing, Cham, Advances in Neural Networks—ISNN 2019, Lecture Notes in Computer Science, Jun. 2019, 11555: 232-241, 10 pages.

Vaferi et al., "Hydrocarbon reservoir model detection from pressure transient data using coupled artificial neural network—Wavelet transform approach," Applied Soft Computing, Elsevier, Amsterdam, NL, Jun. 2016, XP029661645, 47: 63-75, 13 pages.

\* cited by examiner

```
┌─────────────────────────────────────────────────────────────────┐
│ Receive, by a computer system, information obtained from         │
│ hydrocarbon wells, the information including porosity logs,      │
│ petrophysical data, rock typing data, pressure transient test    │
│ results, vertical production logs, reservoir pressure logs,      │
│ reservoir saturation logs, production performance, and           │
│ injection performance                                            │
│                              204                                 │
└─────────────────────────────────────────────────────────────────┘
                                 ↓
┌─────────────────────────────────────────────────────────────────┐
│ Normalize, by the computer system, the reservoir saturation     │
│ logs in accordance with time                                     │
│                              208                                 │
└─────────────────────────────────────────────────────────────────┘
                                 ↓
┌─────────────────────────────────────────────────────────────────┐
│ Train, by the computer system, a machine learning algorithm     │
│ to provide variations in reservoir saturation of the hydrocarbon│
│ reservoir in accordance with time, the machine learning         │
│ algorithm trained using the reservoir saturation logs, the      │
│ vertical production logs, the production performance, the       │
│ injection performance, the reservoir pressure logs, the         │
│ petrophysical data, and the rock typing data                    │
│                              212                                 │
└─────────────────────────────────────────────────────────────────┘
                                 ↓
┌─────────────────────────────────────────────────────────────────┐
│ Train, by the computer system, the machine learning algorithm   │
│ using the reservoir pressure logs, the production performance,  │
│ and the injection performance to provide variations in          │
│ reservoir pressure of the hydrocarbon reservoir in accordance   │
│ with time                                                        │
│                              216                                 │
└─────────────────────────────────────────────────────────────────┘
                                 ↓
┌─────────────────────────────────────────────────────────────────┐
│ Generate, by a display device of the computer system, a        │
│ graphical representation of the variations in the reservoir     │
│ pressure and the variations in the reservoir saturation in      │
│ accordance with time                                             │
│                              220                                 │
└─────────────────────────────────────────────────────────────────┘
```

FIG. 2

Generate, by a computer system, a virtual three-dimensional (3D) model of a hydrocarbon reservoir using a machine learning algorithm, the machine learning algorithm trained using information obtained from a plurality of hydrocarbon wells, the virtual 3D model comprising:
a reservoir pressure model of the hydrocarbon reservoir indicating variations in reservoir pressure in accordance with time; and
a fluid saturation model of the hydrocarbon reservoir indicating variations in reservoir saturation in accordance with time
504

Execute, by the computer system, the machine learning algorithm to determine the variations in the reservoir pressure and the variations in the reservoir saturation with respect to the plurality of hydrocarbon wells based on the virtual 3D model
508

Generate, by a display device of the computer system, a graphical representation of the variations in the reservoir pressure and the variations in the reservoir saturation in accordance with time
512

FIG. 5

TRAINING OF MACHINE LEARNING ALGORITHMS FOR GENERATING A RESERVOIR DIGITAL TWIN

TECHNICAL FIELD

This description relates generally to hydrocarbon wells, for example, to generation of a reservoir digital twin using machine learning.

BACKGROUND

Hydrocarbon recovery from oil wells poses increasing challenges as a result of inadequate data logging across different years and changes in hydrocarbon well dynamics. Traditional methods based on the use of numerical simulation can lead to inefficient results for predicting changes in key hydrocarbon reservoir parameters.

SUMMARY

Methods for training of machine learning algorithms using normalized reservoir logs for generation of a reservoir digital twin include using a computer system to receive information obtained from hydrocarbon wells. The information includes porosity logs, petrophysical data, rock typing data, pressure transient test results, vertical production logs, reservoir pressure logs, reservoir saturation logs, production performance, and injection performance. The computer system normalizes the reservoir saturation logs in accordance with time. The computer system trains a machine learning algorithm using the reservoir pressure logs, the production performance, and the injection performance to provide variations in reservoir pressure of the hydrocarbon reservoir in accordance with time. The computer system trains the machine learning algorithm to provide variations in reservoir saturation of the hydrocarbon reservoir in accordance with time. The machine learning algorithm is trained using the reservoir saturation logs, the vertical production logs, the production performance, the injection performance, the reservoir pressure logs, the petrophysical data, and the rock typing data. A display device of the computer system generates a graphical representation of the variations in the reservoir pressure and the variations in the reservoir saturation in accordance with time.

In some implementations, the information obtained from the multiple hydrocarbon wells further includes pressure transient test results.

In some implementations, the computer system trains the machine learning algorithm to predict variations in reservoir permeability of the hydrocarbon reservoir.

In some implementations, the machine learning algorithm is trained using the pressure transient test results and a vertical production profile of the hydrocarbon reservoir.

In some implementations, the computer system extracts the vertical production profile from the vertical production logs.

In some implementations, the reservoir permeability corresponds to a depth from a surface of the Earth in accordance with the vertical production profile.

In some implementations, the hydrocarbon reservoir includes multiple formations. The machine learning algorithm is trained to predict a vertical reservoir pressure gradient across the formations.

BRIEF DESCRIPTION OF THE DRAWINGS

FIG. 2 illustrates a process for training a machine learning algorithm.

FIG. 5 illustrates a process for generation of a virtual three-dimensional model of a hydrocarbon reservoir.

DETAILED DESCRIPTION

The implementations disclosed provide methods, apparatus, and systems for generation of a reservoir digital twin using machine learning. The implementations create a three-dimensional (3D) digital replica of a hydrocarbon reservoir using artificial intelligence to predict changes in key dynamic reservoir parameters (such as dynamic saturation and pressure) between hydrocarbon wells. Further, the implementations enable the prediction of more efficient production and injection strategies across the reservoir surveillance program compared to traditional methods. The predictions are made independently of the numerical simulation model. The predictions are based on training a machine learning algorithm using static and dynamic data that includes production and injection data, saturation and production logs, reservoir pressure surveillance, petrophysical data, and a geology model.

Among other benefits and advantages, the methods provide a flexible and integrated framework for generation of a reservoir digital twin using machine learning. The implementations disclosed use artificial intelligence to predict changes in reservoir pressure and saturation parameters and reservoir performance during the life cycle of the reservoir, independent of traditional simulation models. The implementations thus generate new hydrocarbon extraction opportunities beyond traditional models. Saturation logs and vertical production logs are normalized against time and are used directly as inputs by the disclosed implementations, while traditional methods that depend on numerical simulation models use such data for only calibration. Hence, the accuracy of the reservoir digital twin model is improved compared to traditional methods. Because the implementations normalize the saturation logs in accordance with time, the implementations provide for more-accurate mapping of the physical reservoir to the digital twin compared to traditional methods.

Figure 1:
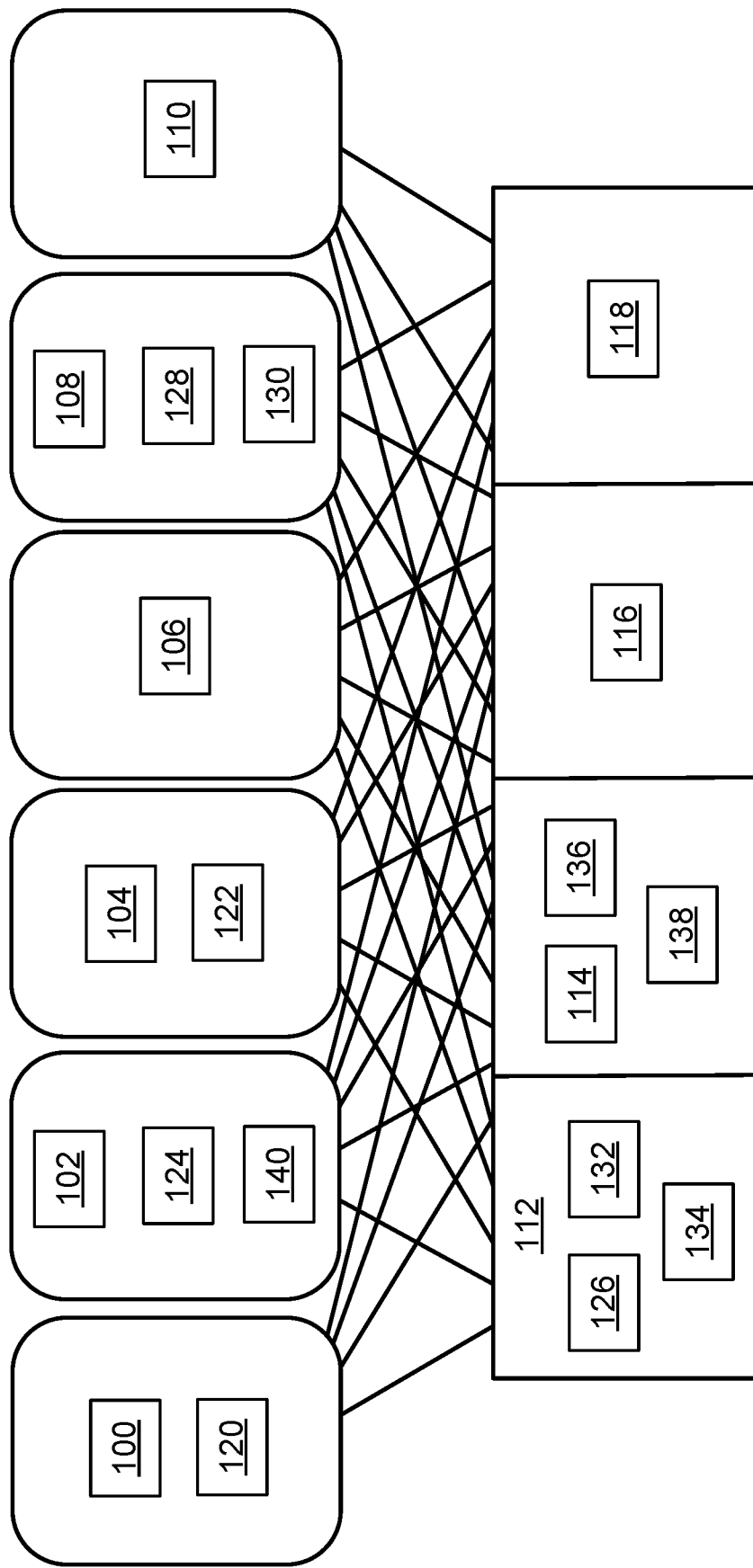
FIG. 1 illustrates an architecture for generation of a reservoir digital twin using machine learning.

FIG. 1 illustrates an architecture for generation of a reservoir digital twin using machine learning, in accordance with one or more implementations. An oil reservoir or hydrocarbon reservoir refers to a subsurface pool of hydrocarbons contained in porous or fractured rock formations. A hydrocarbon well refers to a boring in the Earth that is designed to bring petroleum oil hydrocarbons and natural gas to the surface. Multiple hydrocarbon wells can be bored in a reservoir. The reservoir digital twin refers to a 3D digital replica of a reservoir. The architecture illustrated in FIG. 1 bridges the physical and the virtual world, such that data can be transmitted seamlessly allowing the reservoir digital twin to simultaneously model the physical reservoir. In some implementations, the architecture illustrated in FIG. 1 is processed by the computer system illustrated and described in more detail with reference to FIG. 4.

The computer system receives information obtained from a hydrocarbon reservoir. The hydrocarbon reservoir is associated with multiple hydrocarbon wells. The information obtained from the hydrocarbon reservoir includes the reservoir porosity logs 100 and reservoir saturation logs 110 for the hydrocarbon reservoir. The reservoir porosity logs 100 and the reservoir saturation logs 110 can be derived from well logging tools in a wellbore during the drilling process. A wellbore is a drilling to aid in the exploration and recovery of natural resources including oil, gas or water. The information obtained from the hydrocarbon reservoir further includes petrophysical data 104 and rock typing data 122. The petrophysical data 104 can be used in determinations of lithology, porosity, water saturation, and permeability at the reservoir level. The rock typing data 122 is used to assign reservoir properties to geological facies across the oilfield.

The information obtained from the hydrocarbon reservoir further includes pressure transient test results 124 and vertical production logs 102. The pressure transient test results 124 are a source of the dynamic reservoir data and reflect data obtained from tests on oil and gas wells at different stages of the drilling, completion, and production processes. The vertical production logs 102 reflect downhole flowing production profiles, identify zonal contributions of water, oil, and gas, and can be used to validate and calibrate the reservoir modeling. The information obtained from the hydrocarbon reservoir further includes reservoir pressure logs 108 and reservoir saturation logs 110. The reservoir pressure logs 108 include the static pressure, pressure-depth plots, or the average reservoir pressure across different points in time. The reservoir saturation logs 110 include saturation monitoring logs run at different times according to different logging frequencies. The information obtained from the hydrocarbon reservoir further includes production performance 128 and injection performance 130. The production performance 128 includes production rates of the hydrocarbons while the injection performance 130 includes flow rates of the water or brine used for injecting a hydrocarbon well, bottomhole pressure, and other injection parameters.

A machine learning algorithm of the computer system generates a virtual three-dimensional (3D) model 112 of the hydrocarbon reservoir based on the information obtained from the hydrocarbon reservoir. In some implementations, the machine learning algorithm is part of an Industrial Revolution 4.0 (IR 4.0) framework that is augmented with wireless connectivity and sensors, and connected to a system that can visualize the entire production line using artificial intelligence for decision making. In some implementations, the machine learning algorithm is part of a framework using artificial intelligence, automation and data exchange in manufacturing technologies and processes, including cyber-physical systems (CPS), the internet of things (IoT), industrial internet of things (IIOT), cloud computing, and cognitive computing. For example, the machine learning algorithm can use unsupervised learning (such as K-Means Clustering) or extract features of interest from the information obtained from the hydrocarbon reservoir. In some implementations, artificial neural networks, gradient boosting, or support vectors are used.

The virtual 3D model 112 is sometimes referred to as a digital twin replica or a reservoir digital twin. The virtual 3D model 112 is a 3D sub-surface model of the hydrocarbon reservoir undergoing water injection. Artificial intelligence is used to predict variations in the reservoir saturation 136 based on normalizing the data in the reservoir saturation logs 110 with respect to time for mapping the physical parameters of the hydrocarbon reservoir to the virtual 3D model 112. The virtual 3D model 112 enables reservoir management decisions to be made in less time to increase the efficiency of the production and injection strategy compared to traditional methods. The locations and requirements of infill wells for improving the field performance and reservoir sweep are determined from the virtual 3D model 112.

In some implementations, the machine learning algorithm reduces redundancy in the training data (the received information obtained from the hydrocarbon reservoir) by transforming the training data into a reduced set of features (a feature vector). The feature vector contains the relevant information from the training data, such that features of interest are identified by the machine learning algorithm using the reduced representation instead of the complete training data. In some implementations, the feature vector includes information characterizing key indicators (dynamic data) in the performance of the hydrocarbon reservoir, such as changes in the saturation logs 110, production logs 102, vertical production profile 140, injection performance 130, pressure data 108, and pressure transient tests 124.

In some implementations, the machine learning training and execution methods described combine the use of unsupervised and supervised methods. For example, the machine learning algorithm can begin the training process using unsupervised method for clustering of hydrocarbon wells based on production performance 128, pressure surveys (reservoir pressure logs 108 obtained from a reservoir pressure surveillance program), and pressure transient test results 124. The machine learning algorithm then applies a supervised method per cluster to train the underlying machine learning models and enable the prediction of key reservoir parameters, such as the change in oil saturation 136 and pressure 114 with time. Such a combination of the use of unsupervised and supervised methods addresses the implicitly heterogenic nature of reservoir properties resulting from the presence of geological features and fluids properties that affect fluid flow at the reservoir scale and water breakthrough timing at hydrocarbon wells.

The virtual 3D model 112 includes a dynamic permeability model 126 of the hydrocarbon reservoir indicating variations in reservoir permeability 138 in accordance with a depth from a surface of the Earth. Permeability is a characteristic of a formation or a zone that is used to estimate the flow rate. Permeability is a property of a rock and determined in units of millidarcy (mD). The dynamic permeability model 126 is referred to as being dynamic because the permeability is determined with respect to the depth within the hydrocarbon reservoir using pressure transient tests and production logs from PLTs.

In some implementations, the computer system trains the machine learning algorithm based on the pressure transient test results 124 and a vertical production profile 140 of the hydrocarbon reservoir. The vertical production profile 140 represents the fluid movement in a hydrocarbon well, a composition of the liquid and gas, the temperature of the fluid filling the well, a profile of the pressure gradient, and the amount of water in the fluid. In some implementations, the computer system trains the machine learning algorithm by extracting the vertical production profile 140 from the vertical production logs 102. The vertical production profile 140 is extracted from the vertical production logs 102 using direct measurements by running logs into the borehole and across the hydrocarbon reservoir of interest. The flow rate is measured with respect to the depth from the surface of the earth. The results are determined as a percentage contribution of each depth interval across the hydrocarbon reservoir. The vertical production profile 140 is extracted, such that the reservoir permeability corresponds to the depth from a surface of the Earth. An example vertical production profile 140 is illustrated and described in more detail with reference to FIG. 3.

The trained machine learning algorithm generates the dynamic permeability model 126 of the hydrocarbon reservoir based on the pressure transient test results 124 and the vertical production profile 140. For example, a porosity model is constructed using the porosity logs 100, which include Neutron logs and density logs. The dynamic permeability model 126 is generated using dynamic data from the received information obtained from the hydrocarbon reservoir. For example, the machine learning algorithm generates the dynamic permeability model 126 using data obtained from productivity index (PI) tests and one-phase production logging tools (PLTs). The PI tests include measurements of initial or average reservoir pressure and a measurement of flow rate and flowing bottomhole pressure at stabilized producing conditions. The PI represents well productivity and wellbore conditions during the life of a hydrocarbon well. The PI tests are also used to estimate formation permeability. The machine learning model can distribute the reservoir permeability in accordance with depth according to the production down-hole profile under an assumption that the total permeability estimated by the PI tests is linearly related to the vertical production profile 140 obtained from the PLTs.

The virtual 3D model includes a dynamic reservoir pressure model 132 of the hydrocarbon reservoir indicating variations in the reservoir pressure 114 in accordance with time. In some implementations, the computer system trains the machine learning algorithm using the reservoir pressure logs 108, the production performance 128, and the injection performance 130. For example, an areal pressure distribution and a vertical pressure distribution are determined using the reservoir pressure logs 108 obtained from a reservoir pressure surveillance program over time. The areal pressure distribution refers to the pressure distribution across an area.

The hydrocarbon reservoir includes multiple formations. The dynamic reservoir pressure model 132 indicates a vertical reservoir pressure gradient across the multiple formations. The machine learning algorithm is trained to predict the vertical reservoir pressure gradient across the formations. The machine learning algorithm assumes that the formations are in hydraulic vertical communication. A fixed pressure gradient is assumed to distribute pressure vertically with depth. The resulting pressure is directly related to the injection performance 130 and the production performance 128 in the field, assuming a weak aquifer. A weak aquifer is one in which the water recharge rate is less than the reservoir's fluid withdrawal rate. Such reservoirs are also referred to as partial waterdrives and they are characterized by pressure declines greater than a complete waterdrive but less than a volumetric reservoir. The reservoir pressure variations 114 from the dynamic reservoir pressure model 132 are predicted by training the machine learning algorithm using the production data 128 and the injection data 130 with historical pressure measurements. The machine learning algorithm generates the dynamic reservoir pressure model 132 based on the training data.

The virtual 3D model 112 includes a dynamic fluid saturation model 134 of the hydrocarbon reservoir indicating variations in the reservoir saturation 136 in accordance with time. The machine learning algorithm is trained to provide variations in the reservoir saturation 136 of the hydrocarbon reservoir in accordance with time. The machine learning algorithm is trained using the reservoir saturation logs 110, the vertical production logs 102, the production performance 128, the injection performance 130, the reservoir pressure logs 108, the petrophysical data 104, and the rock typing data 122. The reservoir saturation logs 110 provide the distribution of the vertical and areal initial saturation. Predictions of saturation change with time is generated by the machine learning model using training data including the field-subsurface observed data at the hydrocarbon well level. The training data includes the time lapse with respect to the reservoir saturation logs 110, the time lapse with respect to the PLTs, the production performance 128, the injection performance 130, the reservoir pressure logs 108, and the rock typing data 122. In some implementations, the computer system normalizes the reservoir saturation logs 120 in accordance with time to provide the variations in reservoir saturation 136. The prediction capabilities of the virtual 3D model 112, achieved by artificial intelligence methods, are utilized to predict the amount of saturation in hydrocarbon wells that were not logged at the time of interest for mapping the oil saturation.

In some implementations, the computer system transforms the information obtained from the hydrocarbon reservoir using a variogram in accordance with the variations in the reservoir saturation 136. In other implementations, the machine learning algorithm is used to perform the transformation. In some implementations the variogram is a function describing the degree of spatial dependence of a spatial random field or a stochastic process. For example, a statistical method is adapted to describe graphically the spatial continuity of the porosity and permeability between the hydrocarbon wells. The computer system of FIG. 4 executes the machine learning algorithm to determine the variations in the reservoir pressure 114 and the variations in the reservoir saturation 136 with respect to the multiple hydrocarbon wells based on the virtual 3D model 112.

The machine learning algorithm transforms the reservoir saturation logs 110, the vertical production logs 102, the production performance 128, the injection performance 130, the reservoir pressure logs 108, the petrophysical data 104, and the rock typing data 122 using the variogram. For example, the information obtained from the hydrocarbon reservoir is mapped using a variogram statistical method for 3D modeling while generating the dynamic permeability model 126 and mapping changes in the reservoir saturation with time between the hydrocarbon wells. The predictions of reservoir saturation enables time-normalization of the data for mapping. The time-normalization is useful because logging hydrocarbon wells at a single frequency is expensive. The machine learning algorithm further determines the variations in the reservoir permeability 138, the variations in the reservoir pressure 114, and the variations in the reservoir saturation 136 with respect to the multiple hydrocarbon wells based on the virtual 3D model 112.

A display device (for example, the display device 424 illustrated in FIG. 4) of the computer system generates a graphical representation of the variations in the reservoir permeability 138, the variations in the reservoir pressure 114, and the variations in the reservoir saturation 136 in accordance with time. The display device 424 is illustrated and described in more detail with reference to FIG. 4. The graphical representation portrays the variations in the reservoir permeability 138, the variations in the reservoir pressure 114, and the variations in the reservoir saturation 136 in accordance with time. The graphical representation can include text, pie charts, bar graphs, and numerical values.

In some implementations, the computer system determines locations of infill drillings and a logging frequency 118 based on the virtual 3D model 112. Based on a magnitude of a difference between the predicted dynamic reservoir saturation 136 and observed data, the logging frequency 118 and an annual surveillance program for the oilfield is improved compared to traditional methods. The computer system determines locations of infill drillings by the generated graphical maps of the predicted remaining saturation and pressure at a future time to target areas characterized by increased pressure and a slow change in saturation relative to other areas.

The computer system determines a logging frequency 118 by uncertainty bound analysis to determine a gap between the measured and predicted data. A greater bound suggests that the logging frequency 118 should be increased for the targeted hydrocarbon well or areas. On the other hand, a lesser bound suggests that the logging frequency 118 should be decreased. The locations of the infill drilling and the logging frequency 118 are associated with an increase in a sweep efficiency of the hydrocarbon reservoir compared to traditional methods. The reservoir sweep efficiency refers to the effectiveness of the hydrocarbon recovery, depending on the volume of the hydrocarbon reservoir contacted by the injection fluids. The reservoir sweep efficiency depends on the injection program, fractures in the hydrocarbon reservoir, the positions of hydrocarbon-water contact, the thickness of the hydrocarbon reservoir, the reservoir permeability, a difference in density between the injection fluids and the hydrocarbons, and the flow rate.

The computer system further determines a production strategy 116 based on the virtual 3D model 112 having greater efficiency compared to traditional methods. In some implementations, the improved production strategy 116 generates new extraction opportunities beyond results from numerical simulations to increase the reservoir sweep efficiency and the ultimate hydrocarbon recovery with more efficient planning of the infill drillings. In some implementations, the improved production strategy 116 addresses the complexity of analyzing increased amounts of historical data with increased efficiency and accuracy compared to traditional methods. In some implementations, the improved production strategy 116 reduces bias in data modeling, interpretation, and decision making for more efficient hydrocarbon extraction compared to traditional methods. In some implementations, the improved production strategy 116 provides new optimization insights for reservoir surveillance compared to traditional methods, such as numerical simulation. In some implementations, the improved production strategy 116 enables preventive actions based on timely predictions. In some implementations, the improved production strategy 116 reduces the over-engineering of simple tasks to render accurate and intelligent decisions with improved engineering efficiency compared to numerical simulation.

FIG. 2 illustrates a process for training a machine learning algorithm. The machine learning algorithm is used for generation of a reservoir digital twin (for example, the virtual 3D model 112 illustrated in FIG. 1). In some implementations the process of FIG. 2 is performed by the computer system illustrated and described in more detail with reference to FIG. 4.

The computer system receives 204 information obtained from a hydrocarbon reservoir. The hydrocarbon reservoir is associated with multiple hydrocarbon wells. The information includes porosity logs 100, petrophysical data 104, rock typing data 122, pressure transient test results 124, vertical production logs 102, reservoir pressure logs 108, reservoir saturation logs 110, production performance 128, and injection performance 130.

The computer system normalizes 208 the reservoir saturation logs 110 in accordance with time. Artificial intelligence can be used to predict variations in the reservoir saturation 136 based on normalizing the data in the reservoir saturation logs 110 with respect to time for mapping the physical parameters of the hydrocarbon reservoir to the virtual 3D model 112. The virtual 3D model 112 is illustrated and described in more detail with reference to FIG. 1.

The computer system trains 212 a machine learning algorithm to provide variations in reservoir saturation 136 of the hydrocarbon reservoir in accordance with time. The machine learning algorithm is trained using the reservoir saturation logs 110, the vertical production logs 102, the production performance 128, the injection performance 130, the reservoir pressure logs 108, the petrophysical data 104, and the rock typing data 122.

The computer system trains 216 the machine learning algorithm using the reservoir pressure logs 108, the production performance 128, and the injection performance 130 to provide variations in reservoir pressure 114 of the hydrocarbon reservoir in accordance with time. For example, an areal pressure distribution and a vertical pressure distribution are determined using the reservoir pressure logs 108 obtained from a reservoir pressure surveillance program over time. The areal pressure distribution refers to the pressure distribution across an area. In some implementations, the computer system trains the machine learning algorithm using any one or more of the following methods: independent component analysis, Isomap, Kernel PCA, latent semantic analysis, partial least squares, principal component analysis, multifactor dimensionality reduction, nonlinear dimensionality reduction, multilinear principal component analysis, multilinear subspace learning, semidefinite embedding, Autoencoder, and deep feature synthesis.

A display device (for example, the display device 424 in FIG. 4) of the computer system generates 220 a graphical representation of the variations in the reservoir permeability 138, the variations in the reservoir pressure 114, and the variations in the reservoir saturation 136 in accordance with time. The display device 424 is illustrated and described in more detail with reference to FIG. 4. The graphical representation portrays the variations in the reservoir permeability 138, the variations in the reservoir pressure 114, and the variations in the reservoir saturation 136 in accordance with time. The graphical representation can include text, pie charts, bar graphs, and numerical values.

Figure 3:
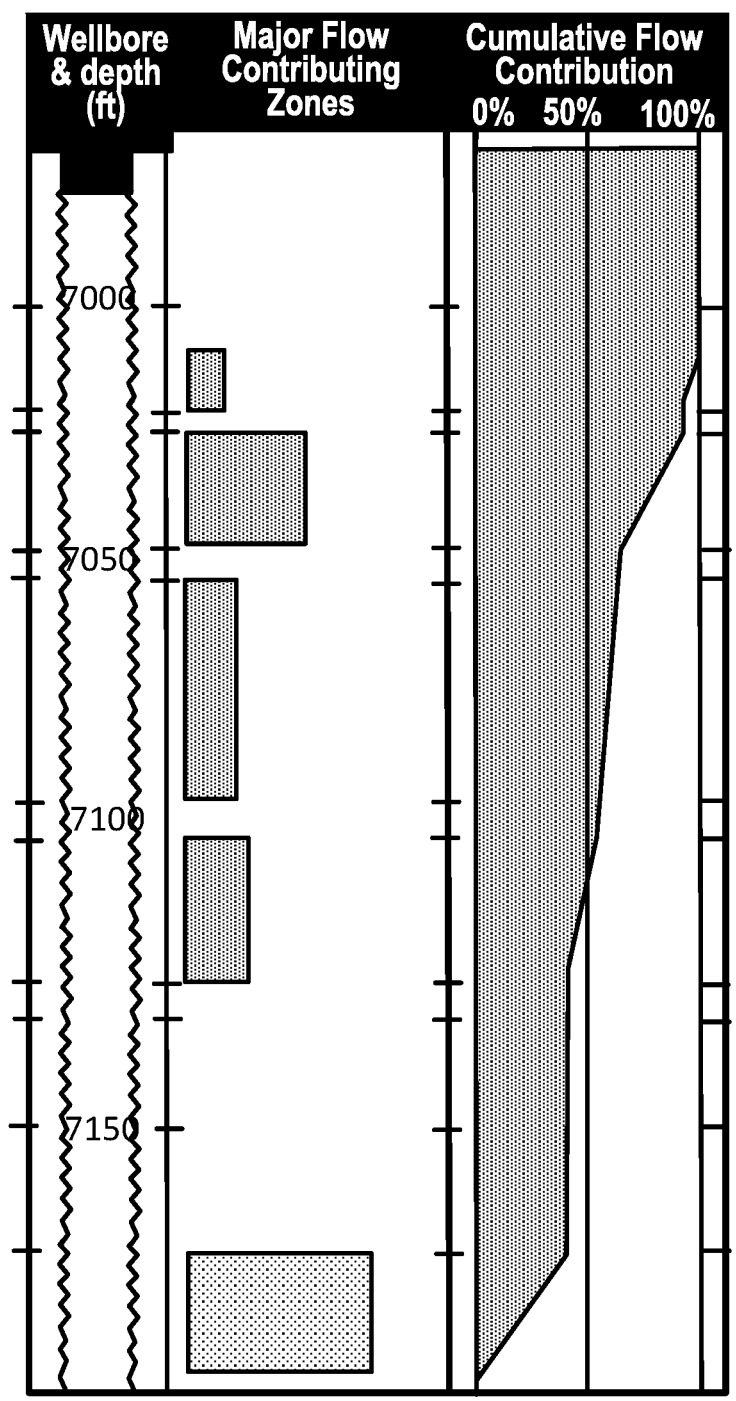
FIG. 3 illustrates an example vertical production profile.

FIG. 3 illustrates an example vertical production profile 140. The vertical production profile 140 is obtained using the vertical production logs 102 obtained from PLTs. The vertical production logs 102 measure the flow rate in accordance with the depth indicating zones within the reservoir in addition to identifying water and oil entries. The vertical production profile 140 is sometimes referred to as a formation signature through which the ability of the different zones to flow oil, water, or both is defined relative to each other.

Figure 4:
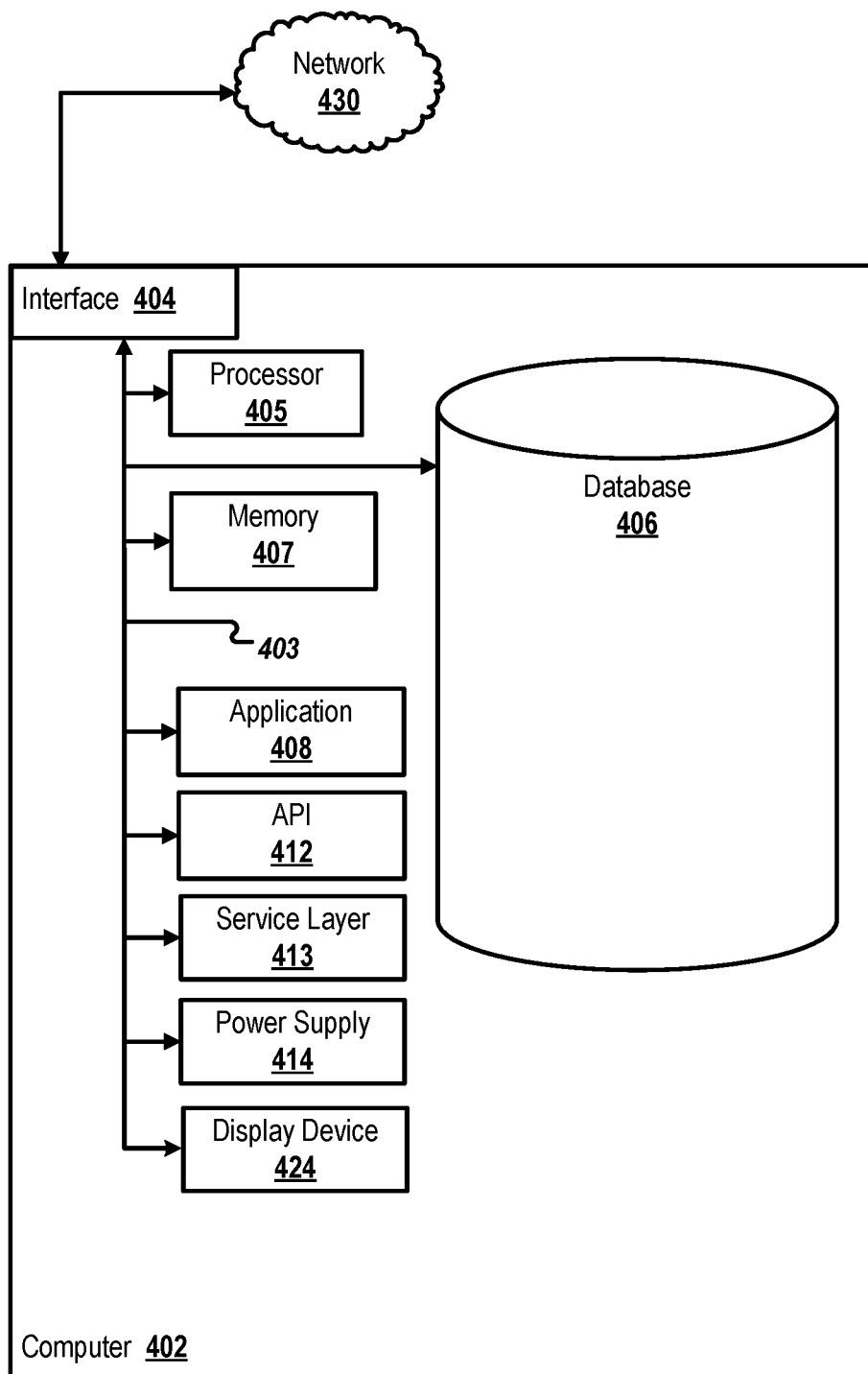
FIG. 4 illustrates an example machine.

FIG. 4 is a block diagram of an example computer system used to provide computational functionalities associated with described algorithms, methods, functions, processes, flows, and procedures described in the present disclosure, according to some implementations of the present disclosure. The illustrated computer 402 is intended to encompass any computing device such as a server, a desktop computer, a laptop or notebook computer, a wireless data port, a smart phone, a personal data assistant (PDA), a tablet computing device, or one or more processors within these devices, including physical instances, virtual instances, or both. The computer 402 can include input devices such as keypads, keyboards, and touch screens that can accept user information. Also, the computer 402 can include output display devices 424 that can convey information associated with the operation of the computer 402. The information can include digital data, visual data, audio information, or a combination of information. The information can be presented in a graphical user interface (UI) (or GUI).

The computer 402 can serve in a role as a client, a network component, a server, a database, a persistency, or components of a computer system for performing the subject matter described in the present disclosure. The illustrated computer 402 is communicably coupled with a network 430. In some implementations, one or more components of the computer 402 can be configured to operate within different environments, including cloud-computing-based environments, local environments, global environments, and combinations of environments.

At a top level, the computer 402 is an electronic computing device operable to receive, transmit, process, store, and manage data and information associated with the described subject matter. According to some implementations, the computer 402 can also include, or be communicably coupled with, an application server, an email server, a web server, a caching server, a streaming data server, or a combination of servers.

The computer 402 can receive requests over network 430 from a client application (for example, executing on another computer 402). The computer 402 can respond to the received requests by processing the received requests using software applications. Requests can also be sent to the computer 402 from internal users (for example, from a command console), external (or third) parties, automated applications, entities, individuals, systems, and computers.

Each of the components of the computer 402 can communicate using a system bus 403. In some implementations, any or all of the components of the computer 402, including hardware or software components, can interface with each other or the interface 304 (or a combination of both) over the system bus 403. Interfaces can use an application programming interface (API) 412, a service layer 413, or a combination of the API 412 and service layer 413. The API 412 can include specifications for routines, data structures, and object classes. The API 412 can be either computer-language independent or dependent. The API 412 can refer to a complete interface, a single function, or a set of APIs.

The service layer 413 can provide software services to the computer 402 and other components (whether illustrated or not) that are communicably coupled to the computer 402. The functionality of the computer 402 can be accessible for all service consumers using this service layer. Software services, such as those provided by the service layer 413, can provide reusable, defined functionalities through a defined interface. For example, the interface can be software written in JAVA, C++, or a language providing data in extensible markup language (XML) format. While illustrated as an integrated component of the computer 402, in alternative implementations, the API 412 or the service layer 413 can be stand-alone components in relation to other components of the computer 402 and other components communicably coupled to the computer 402. Moreover, any or all parts of the API 412 or the service layer 413 can be implemented as child or sub-modules of another software module, enterprise application, or hardware module without departing from the scope of the present disclosure.

The computer 402 includes an interface 404. Although illustrated as a single interface 404 in FIG. 4, two or more interfaces 404 can be used according to particular needs, desires, or particular implementations of the computer 402 and the described functionality. The interface 404 can be used by the computer 402 for communicating with other systems that are connected to the network 430 (whether illustrated or not) in a distributed environment. Generally, the interface 404 can include, or be implemented using, logic encoded in software or hardware (or a combination of software and hardware) operable to communicate with the network 430. More specifically, the interface 404 can include software supporting one or more communication protocols associated with communications. As such, the network 430 or the interface's hardware can be operable to communicate physical signals within and outside of the illustrated computer 402.

The computer 402 includes a processor 405. Although illustrated as a single processor 405 in FIG. 4, two or more processors 405 can be used according to particular needs, desires, or particular implementations of the computer 402 and the described functionality. Generally, the processor 405 can execute instructions and can manipulate data to perform the operations of the computer 402, including operations using algorithms, methods, functions, processes, flows, and procedures as described in the present disclosure.

The computer 402 also includes a database 406 that can hold data for the computer 402 and other components connected to the network 430 (whether illustrated or not). For example, database 406 can be an in-memory, conventional, or a database storing data consistent with the present disclosure. In some implementations, database 406 can be a combination of two or more different database types (for example, hybrid in-memory and conventional databases) according to particular needs, desires, or particular implementations of the computer 402 and the described functionality. Although illustrated as a single database 406 in FIG. 4, two or more databases (of the same, different, or combination of types) can be used according to particular needs, desires, or particular implementations of the computer 402 and the described functionality. While database 406 is illustrated as an internal component of the computer 402, in alternative implementations, database 406 can be external to the computer 402.

The computer 402 also includes a memory 407 that can hold data for the computer 402 or a combination of components connected to the network 430 (whether illustrated or not). Memory 407 can store any data consistent with the present disclosure. In some implementations, memory 407 can be a combination of two or more different types of memory (for example, a combination of semiconductor and magnetic storage) according to particular needs, desires, or particular implementations of the computer 402 and the described functionality. Although illustrated as a single memory 407 in FIG. 4, two or more memories 407 (of the same, different, or combination of types) can be used according to particular needs, desires, or particular implementations of the computer 402 and the described functionality. While memory 407 is illustrated as an internal component of the computer 402, in alternative implementations, memory 407 can be external to the computer 402.

The application 408 can be an algorithmic software engine providing functionality according to particular needs, desires, or particular implementations of the computer 402 and the described functionality. For example, application 408 can serve as one or more components, modules, or applications. Further, although illustrated as a single application 408, the application 408 can be implemented as multiple applications 408 on the computer 402. In addition, although illustrated as internal to the computer 402, in alternative implementations, the application 408 can be external to the computer 402.

The computer 402 can also include a power supply 414. The power supply 414 can include a rechargeable or non-rechargeable battery that can be configured to be either user- or non-user-replaceable. In some implementations, the power supply 414 can include power-conversion and management circuits, including recharging, standby, and power management functionalities. In some implementations, the power-supply 414 can include a power plug to allow the computer 402 to be plugged into a wall socket or a power source to, for example, power the computer 402 or recharge a rechargeable battery.

There can be any number of computers 402 associated with, or external to, a computer system containing computer 402, with each computer 402 communicating over network 430. Further, the terms client, user, and other appropriate terminology can be used interchangeably, as appropriate, without departing from the scope of the present disclosure. Moreover, the present disclosure contemplates that many users can use one computer 402 and one user can use multiple computers 402.

FIG. 5 illustrates a process for generation of a reservoir digital twin (for example, the virtual 3D model 112 illustrated in FIG. 1). In some implementations the process of FIG. 5 is performed by the computer system illustrated and described in more detail with reference to FIG. 4.

The computer system generates 504 the virtual 3D model 112 of a hydrocarbon reservoir using a machine learning algorithm. The machine learning algorithm is trained using information obtained from multiple hydrocarbon wells. The virtual 3D model 112 includes a reservoir pressure model 132 of the hydrocarbon reservoir indicating variations in reservoir pressure 114 in accordance with time. The virtual 3D model 112 further includes a fluid saturation model 134 of the hydrocarbon reservoir indicating variations in reservoir saturation 136 in accordance with time.

The computer system executes 508 the machine learning algorithm to determine the variations in the reservoir pressure 114 and the variations in the reservoir saturation 136 with respect to the multiple hydrocarbon wells based on the virtual 3D model 112.

A display device (for example, the display device 424 in FIG. 4) of the computer system generates 512 a graphical representation of the variations in the reservoir permeability 138, the variations in the reservoir pressure 114, and the variations in the reservoir saturation 136 in accordance with time. The display device 424 is illustrated and described in more detail with reference to FIG. 4. The graphical representation portrays the variations in the reservoir permeability 138, the variations in the reservoir pressure 114, and the variations in the reservoir saturation 136 in accordance with time. The graphical representation can include text, pie charts, bar graphs, and numerical values.

What is claimed is:

1. A method comprising:
receiving, by a computer system, information obtained from a plurality of hydrocarbon wells, the information comprising porosity logs, petrophysical data, rock typing data, pressure transient test results, vertical production logs, reservoir pressure logs, reservoir saturation logs, production performance, and injection performance;
normalizing, by the computer system, the reservoir saturation logs in accordance with time;
training, by the computer system, a machine learning algorithm to provide variations in reservoir saturation of a hydrocarbon reservoir in accordance with time, the machine learning algorithm trained using the reservoir saturation logs, the vertical production logs, the production performance, the injection performance, the reservoir pressure logs, the petrophysical data, and the rock typing data, wherein the training combines unsupervised learning and supervised learning;
training, by the computer system, the machine learning algorithm using the reservoir pressure logs, the production performance, and the injection performance to provide variations in reservoir pressure of the hydrocarbon reservoir in accordance with time, wherein the training combines unsupervised learning and supervised learning;
generating, by a display device of the computer system, a graphical representation of the variations in the reservoir pressure and the variations in the reservoir saturation in accordance with time; and
infill drilling at locations of the hydrocarbon reservoir to target areas of the hydrocarbon reservoir associated with an increased sweep efficiency.

2. The method of claim 1, wherein the information obtained from the plurality of hydrocarbon wells further comprises pressure transient test results.

3. The method of claim 2, further comprising training, by the computer system, the machine learning algorithm to predict variations in reservoir permeability of the hydrocarbon reservoir.

4. The method of claim 3, wherein the machine learning algorithm is trained using the pressure transient test results and a vertical production profile of the hydrocarbon reservoir.

5. The method of claim 4, further comprising extracting, by the computer system, the vertical production profile from the vertical production logs.

6. The method of claim 4, wherein the reservoir permeability corresponds to a depth from a surface of Earth in accordance with the vertical production profile.

7. The method of claim 1, wherein the hydrocarbon reservoir comprises a plurality of formations, the machine learning algorithm trained to predict a vertical reservoir pressure gradient across the plurality of formations.

8. A non-transitory computer-readable storage medium storing instructions executable by one or more computer processors, the instructions when executed by the one or more computer processors cause the one or more computer processors to:
receive information obtained from a plurality of hydrocarbon wells, the information comprising porosity logs, petrophysical data, rock typing data, pressure transient test results, vertical production logs, reservoir pressure logs, reservoir saturation logs, production performance, and injection performance;
normalize the reservoir saturation logs in accordance with time;
train a machine learning algorithm to provide variations in reservoir saturation of a hydrocarbon reservoir in accordance with time, the machine learning algorithm trained using the reservoir saturation logs, the vertical production logs, the production performance, the injection performance, the reservoir pressure logs, the petrophysical data, and the rock typing data, wherein training the machine learning algorithm to provide variations in reservoir saturation combines unsupervised learning and supervised learning;
train the machine learning algorithm using the reservoir pressure logs, the production performance, and the injection performance to provide variations in reservoir pressure of the hydrocarbon reservoir in accordance with time, wherein training the machine learning algorithm to provide variations in reservoir pressure combines unsupervised learning and supervised learning;

generate a graphical representation of the variations in the reservoir pressure and the variations in the reservoir saturation in accordance with time; and infill drilling at locations of the hydrocarbon reservoir to target areas of the hydrocarbon reservoir associated with an increased sweep efficiency.

9. The non-transitory computer-readable storage medium of claim 8, wherein the information obtained from the plurality of hydrocarbon wells further comprises pressure transient test results.

10. The non-transitory computer-readable storage medium of claim 9, wherein the instructions further cause the one or more computer processors to train the machine learning algorithm to predict variations in reservoir permeability of the hydrocarbon reservoir.

11. The non-transitory computer-readable storage medium of claim 10, wherein the machine learning algorithm is trained using the pressure transient test results and a vertical production profile of the hydrocarbon reservoir.

12. The non-transitory computer-readable storage medium of claim 11, wherein the instructions further cause the one or more computer processors to extract the vertical production profile from the vertical production logs.

13. The non-transitory computer-readable storage medium of claim 11, wherein the reservoir permeability corresponds to a depth from a surface of Earth in accordance with the vertical production profile.

14. The non-transitory computer-readable storage medium of claim 8, wherein the hydrocarbon reservoir comprises a plurality of formations, the machine learning algorithm trained to predict a vertical reservoir pressure gradient across the plurality of formations.

15. A computer system comprising:
one or more computer processors; and
a non-transitory computer-readable storage medium storing instructions executable by the one or more computer processors, the instructions when executed by the one or more computer processors cause the one or more computer processors to:
receive information obtained from a plurality of hydrocarbon wells, the information comprising porosity logs, petrophysical data, rock typing data, pressure transient test results, vertical production logs, reservoir pressure logs, reservoir saturation logs, production performance, and injection performance;

normalize the reservoir saturation logs in accordance with time;

train a machine learning algorithm to provide variations in reservoir saturation of a hydrocarbon reservoir in accordance with time, the machine learning algorithm trained using the reservoir saturation logs, the vertical production logs, the production performance, the injection performance, the reservoir pressure logs, the petrophysical data, and the rock typing data, wherein training the machine learning algorithm to provide variations in reservoir saturation combines unsupervised learning and supervised learning;

train the machine learning algorithm using the reservoir pressure logs, the production performance, and the injection performance to provide variations in reservoir pressure of the hydrocarbon reservoir in accordance with time, wherein training the machine learning algorithm to provide variations in reservoir pressure combines unsupervised learning and supervised learning;

generate a graphical representation of the variations in the reservoir pressure and the variations in the reservoir saturation in accordance with time; and infill drilling at locations of the hydrocarbon reservoir to target areas of the hydrocarbon reservoir associated with an increased sweep efficiency.

16. The computer system of claim 15, wherein the information obtained from the plurality of hydrocarbon wells further comprises pressure transient test results.

17. The computer system of claim 16, wherein the instructions further cause the one or more computer processors to train the machine learning algorithm to predict variations in reservoir permeability of the hydrocarbon reservoir.

18. The computer system of claim 17, wherein the machine learning algorithm is trained using the pressure transient test results and a vertical production profile of the hydrocarbon reservoir.

19. The computer system of claim 18, wherein the instructions further cause the one or more computer processors to extract the vertical production profile from the vertical production logs.

20. The computer system of claim 18, wherein the reservoir permeability corresponds to a depth from a surface of Earth in accordance with the vertical production profile.

\* \* \* \* \*